United States Patent
Ning

(10) Patent No.: US 11,320,484 B2
(45) Date of Patent: May 3, 2022

(54) TEST METHOD AND TEST SYSTEM

(71) Applicant: Changxin Memory Technologies, Inc., Anhui (CN)

(72) Inventor: Shu-Liang Ning, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 0 days.

(21) Appl. No.: 17/167,382

(22) Filed: Feb. 4, 2021

(65) Prior Publication Data

US 2021/0156914 A1    May 27, 2021

Related U.S. Application Data

(63) Continuation of application No. PCT/CN2019/106359, filed on Sep. 18, 2019.

(30) Foreign Application Priority Data

Sep. 28, 2018  (CN) .......................... 201811137146.5
Sep. 28, 2018  (CN) .......................... 201821631055.2

(51) Int. Cl.
   *G01R 31/3177*    (2006.01)
   *G01R 31/317*     (2006.01)
   (Continued)

(52) U.S. Cl.
   CPC ..... *G01R 31/3177* (2013.01); *G01R 31/3172* (2013.01); *G01R 31/3187* (2013.01);
   (Continued)

(58) Field of Classification Search
   CPC ........ G01R 31/3177; G01R 31/318536; G01R 31/31727; G01R 31/318544;
   (Continued)

(56) References Cited

U.S. PATENT DOCUMENTS 6,980,009 B2   12/2005  Maciejewski et al.
7,275,187 B2    9/2007  Kawasaki
                        (Continued)

FOREIGN PATENT DOCUMENTS

CN       1489156 A     4/2004
CN     101025996 A     8/2007
                        (Continued)

OTHER PUBLICATIONS

PCT International Search Report and the Written Opinion dated Dec. 5, 2019, issued in related International Application No. PCT/CN2019/106359 (8 pages).

*Primary Examiner* — April Y Blair
*Assistant Examiner* — Sazzad Hossain
(74) *Attorney, Agent, or Firm* — Sheppard Mullin Richter & Hampton LLP

(57) ABSTRACT

The present invention provides a method, device, and system for testing devices under testing (DUTs). The method comprises: sending a scan activated signal and a synchronous clock signal via the second signal line, and sending a first preset signal via the serial signal line, wherein each bit of the first preset signal is transmitted to a corresponding scan chain unit in a sequence of serial connection of the plurality of scan chain units with according to the synchronous clock signal, the corresponding scan chain unit is one of the plurality of scan chain units connected serially and coupled to the plurality of DUTs via a third signal line; sending a scan deactivated signal via the second signal line, to deactivate the scan chain units from identifying and receiving the first preset signal; and sending a second preset signal via the second signal line, and sending a test signal via the first signal line.

19 Claims, 5 Drawing Sheets

(51) Int. Cl.
*G01R 31/3187* (2006.01)
*G01R 31/3185* (2006.01)

(52) U.S. Cl.
CPC .. *G01R 31/31704* (2013.01); *G01R 31/31705* (2013.01); *G01R 31/31723* (2013.01); *G01R 31/31724* (2013.01); *G01R 31/31727* (2013.01); *G01R 31/318533* (2013.01); *G01R 31/318536* (2013.01); *G01R 31/318544* (2013.01); *G01R 31/318563* (2013.01); *G01R 31/318583* (2013.01); *G01R 31/318597* (2013.01)

(58) Field of Classification Search
CPC ........ G01R 31/31724; G01R 31/31705; G01R 31/31723; G01R 31/318533; G01R 31/318597; G01R 31/318563; G01R 31/31704; G01R 31/318583; G01R 31/3187; G01R 31/3172
See application file for complete search history.

(56) References Cited

U.S. PATENT DOCUMENTS

| | | | |
|---|---|---|---|
| 7,499,364 | B2 | 3/2009 | Ahn et al. |
| 2008/0023700 | A1* | 1/2008 | Gschwind ...... G01R 31/318569 257/48 |
| 2008/0282122 | A1* | 11/2008 | Guettaf .......... G01R 31/318594 714/731 |
| 2013/0173979 | A1* | 7/2013 | Goessel ......... G01R 31/318547 714/727 |
| 2014/0298124 | A1* | 10/2014 | Douskey ............ G01R 31/3177 714/726 |

FOREIGN PATENT DOCUMENTS

| | | |
|---|---|---|
| CN | 102890232 A | 1/2013 |
| CN | 108008284 A | 5/2018 |
| CN | 109270432 A | 1/2019 |
| CN | 209215538 U | 8/2019 |

* cited by examiner

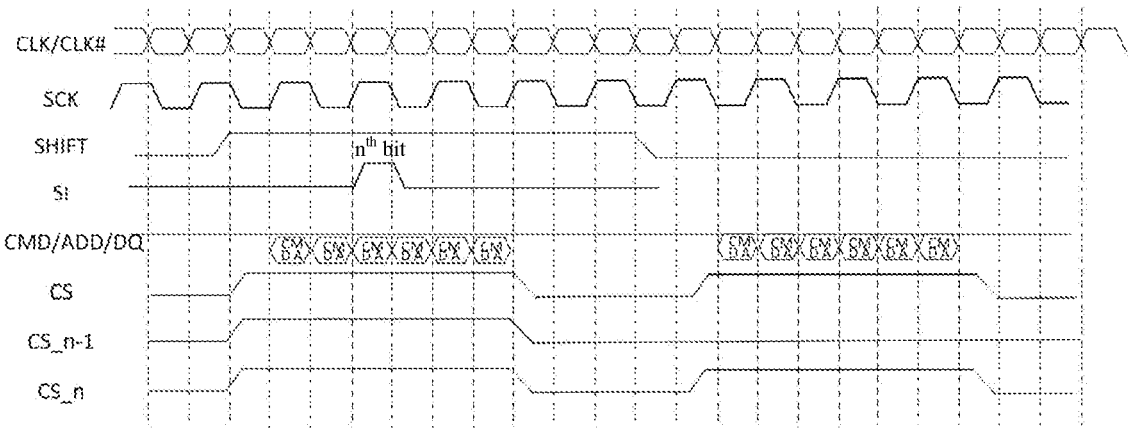

FIG. 4 sending a scan activated signal and a synchronous clock signal via the second signal line, and sending a first preset signal having multiple bits via the serial signal line, wherein each bit of the first preset signal is transmitted to a corresponding scan chain unit in a sequence of serial connection of the multiple scan chain units according to the synchronous clock signal
/ Step S1A sending a scan deactivated signal via the second signal line, to deactivate the scan chain units from identifying and receiving the first preset signal
/ Step S2A Sending a second preset signal via the seconding signal line and send a test signal via the first signal line.
/ Step S3A

FIG. 5A ofTEST METHOD AND TEST SYSTEM

CROSS-REFERENCE TO RELATED APPLICATION

This application is a continuation application of International Patent Application No. PCT/CN2019/106359, filed on Sep. 18, 2019, which is based on and claims priority of the Chinese Patent Application Nos. 201811137146.5 and 201821631055.2, both filed on Sep. 28, 2018 and entitled "TEST METHOD AND TEST SYSTEM." The above-referenced applications are incorporated herein by reference in their entirety.

TECHNICAL FIELD

The present invention relates to the field of semiconductors technology, and in particular, to a test method and test system capable of individually testing multiple devices under testing (DUTs).

BACKGROUND

When multiple DUTs are tested in the related art, to implement individual testing on each DUT, it is usually required to provide an individual chip selection line for each DUT.

FIG. 1 is a schematic diagram of a test scenario for multiple DUTs in the related art. Referring to FIG. 1, each of five DUTs occupies one input/output (I/O) interface. Since the test device/test equipment has limited I/O interfaces available, occupying the I/O interfaces for each of the chip selection lines reduces the efficiency of the test device, and the number of the DUTs that can be tested by the test device.

Therefore, it is necessary to improve the test method for multiple DUTs, to increase the number of DUTs that can be simultaneously connected to and tested by the test device, and thus to improve the test efficiency of the DUTs.

It is to be noted that the information disclosed in the above Background is merely for enhancing the understanding on the background of the present invention, and thus the included information may not constitute prior art known to those of ordinary skill in the art.

SUMMARY

Embodiments of the present invention provide a test method and a test system, to overcome the problems of the low number of DUTs connected to a test device/test equipment due to limitations and defects of the related art.

According to a first aspect of the present invention, there is provided a test method for a test equipment. The method comprises coupling the test equipment to multiple devices under testing (DUTs) via a first signal line, to multiple scan chain units via a second signal line, and to a first scan chain unit via a serial signal line, sending a scan activated signal and a synchronous clock signal via the second signal line, and sending a first preset signal having multiple bits via the serial signal line, wherein each bit of the first preset signal is transmitted to a corresponding scan chain unit in a sequence of serial connection of the multiple scan chain units according to the synchronous clock signal, wherein the corresponding scan chain unit is one of the multiple scan chain units connected serially and coupled to the multiple DUTs via a third signal line, sending a scan deactivated signal via the second signal line, to deactivate the scan chain units from identifying and receiving the first preset signal, and sending a second preset signal via the second signal line, and sending a test signal via the first signal line.

In an embodiment of the present invention, the first signal line comprises a data signal line, an address signal line, and a control signal line, the second signal line comprises a scan enable signal line, a synchronous clock signal line, and a chip selection signal line, the third signal line comprises a secondary chip selection signal line, the first preset signal comprises a first chip selection signal, and the second preset signal comprises a second chip selection signal.

In an embodiment of the present invention, sending the scan activated signal and synchronous clock signal via the second signal line and sending the first preset signal via the serial signal line comprises: sending the scan activated signal via the scan enable signal line, and sending the synchronous clock signal via the synchronous clock signal line, and sending the first chip selection signal having multiple bits via the serial signal line, via the secondary chip selection signal line, to a corresponding DUT.

In an embodiment of the present invention, the sending the second preset signal via the second signal line and sending the test signal via the first signal line comprises sending the second chip selection signal via the chip selection signal line to active a DUT corresponding to an activated status bit in the first chip selection signal, and simultaneously sending a write control instruction, a write address, and write data via the control signal line, the address signal line, and the data signal line, respectively.

In an embodiment of the present invention, the first chip selection signal comprises more than one activated status bits thereof, sending the second chip selection signal to active more than one DUTs corresponding to the more than one activated status bits of the first chip selection signal, and simultaneously sending a write control instruction, a write address, and write data to the more than one activated DUTs.

In an embodiment of the present invention, when only one bit in the first chip selection signal is in an activated status, sending the second preset signal via the second signal line and sending the test signal via the first signal line comprises: sending the second chip selection signal via the chip selection signal line to active a DUT corresponding to an activated status bit in the first chip selection signal, and simultaneously sending a read control instruction and a read address via the control signal line and the address signal line, respectively, and reading the activated DUT via the data signal line.

According to a second aspect of the present invention, there is provided a test system comprising a test equipment, having a first signal line, a second signal line, and a serial signal line, multiple devices under testing (DUTs), coupled to the test equipment via the first signal line, and multiple serially-connected scan chain units coupled to the test equipment via the second signal line, respectively coupled to the multiple DUTs via a third signal line. A first scan chain unit is coupled to the test equipment via the serial signal line.

In an embodiment of the present invention, the test equipment is configured to send a scan activated signal and a synchronous clock signal via the second signal line, and send a first preset signal having multiple bits via the serial signal line, wherein each bit of the first preset signal is transmitted to a corresponding scan chain unit in a sequence of serial connection of the scan chain units according to the synchronous clock signal, send a scan deactivated signal via the second signal, to deactivate the scan chain units from identifying and receiving the first preset signal, and send a second preset signal via the second signal line, and send a test signal via the first signal line.

In an embodiment of the present invention, the first signal line comprises a data signal line, an address signal line, and a control signal line, the second signal line comprises a scan enable signal line, a synchronous clock signal line, and a chip selection signal line, and the third signal line comprises a secondary chip selection signal line.

In an embodiment of the present invention, each scan chain reg includes a first multiplexer comprising a first input pin coupled to a serial signal input port, a second input pin coupled to a serial signal output port, and a control pin coupled to the scan enable signal line, a D flip-flop comprising an input pin coupled to an output pin of the first multiplexer, an output pin coupled to the serial signal output port, and a control pin coupled to the synchronous clock signal line, an OR gate comprising a first input pin coupled to the scan enable signal line, and a second input pin coupled to the serial signal output port, a second multiplexer comprising a first input pin coupled to the chip selection signal line, a second input pin in a high impedance status, and a control pin coupled to an output pin of the OR gate, and a driver comprising an input pin coupled to an output pin of the second multiplexer, and an output pin coupled to the secondary chip selection signal line.

In an embodiment of the present invention, the test equipment is configured to send the scan activated signal via the scan enable signal line, send the synchronous clock signal via the synchronous clock signal line, and send a first chip selection signal having multiple bits via the serial signal line, via the secondary chip selection signal line, to a corresponding DUT, send a scan deactivated signal via the scan enable signal line, and send a second chip selection signal via the chip selection signal line, and send the test signal via the control signal line, the address signal line, and the data signal line.

In an embodiment of the present invention, sending the second chip selection signal via the chip selection signal line, and sending the test signal via the control signal line, the address signal line, and the data signal line comprises sending the second chip selection signal via the chip selection signal line to active a DUT corresponding to an activated status bit in the first chip selection signal, and simultaneously sending a write control instruction, a write address, and write data via the control signal line, the address signal line, and the data signal line, respectively.

In an embodiment of the present invention, when only one bit in the first chip selection signal is in an activated status, the sending the second chip selection signal via the chip selection signal line, and sending the test signal via the control signal line, the address signal line, and the data signal line comprises: sending the second chip selection signal via the chip selection signal line to active a DUT corresponding to an activated status bit in the first chip selection signal, and simultaneously sending a read control instruction and a read address via the control signal line and the address signal line, respectively, and reading the activated DUT via the data signal line.

According to a third aspect of the present invention, there is provided a test equipment, including a first signal line, a second signal line, and a serial signal line, wherein the first signal line is coupled to multiple devices under testing (DUTs), the second signal line is coupled to multiple scan chain units, the multiple scan chain units are respectively coupled to the multiple DUTs via a third signal line, the multiple scan chain units are serially connected, a first scan chain unit is coupled to the serial signal line, and each scan chain unit comprises at least a D flip-flop and a multiplexer; a memory; and a processor coupled to the memory, wherein the processor is configured to execute an instruction stored in the memory to perform operations including sending a scan activated signal and a synchronous clock signal via the second signal line, and sending a first preset signal having multiple bits via the serial signal line, wherein each bit of the first preset signal is transmitted to a corresponding scan chain unit in a sequence of serial connection of multiple scan chain units according to the synchronous clock signal, wherein the corresponding scan chain unit is one of the multiple scan chain units connected serially and coupled to the multiple DUTs via a third signal line, sending a scan deactivated signal via the second signal line, to deactivate the scan chain units from identifying and receiving the first preset signal, and sending a second preset signal via the second signal line, and sending a test signal via the first signal line.

According to the test method, the test equipment and the test system provided by the embodiments of the present invention, a serial signal having the number of bits corresponding to the number of DUTs is used and output to scan chain units corresponding to the DUTs, so that each scan chain unit can store and output a signal corresponding to one DUT, and with output signals of one pin to multiple DUTs, the pins of the test equipment may be effectively reduced.

It is to be understood that both the foregoing summary and the following detailed description are exemplary and explanatory only and are not necessarily restrictive to the present invention.

BRIEF DESCRIPTION OF DRAWINGS

The accompanying drawings, which are incorporated in and constitute a part of the specification, illustrate embodiments of the present invention and, together with the specification, serve to explain the principles of the present invention. Apparently, the accompanying drawings in the following description are only some embodiments of the present invention, and those of ordinary skill in the art can derive other drawings from the accompanying drawings without creative efforts.

FIG. 4 is a time diagram of control of a scan chain unit shown in FIG. 3.

FIG. 5A and FIG. 5B are flowcharts of a test method in an embodiment of the present invention.

DESCRIPTION OF EMBODIMENTS

Figure 1:
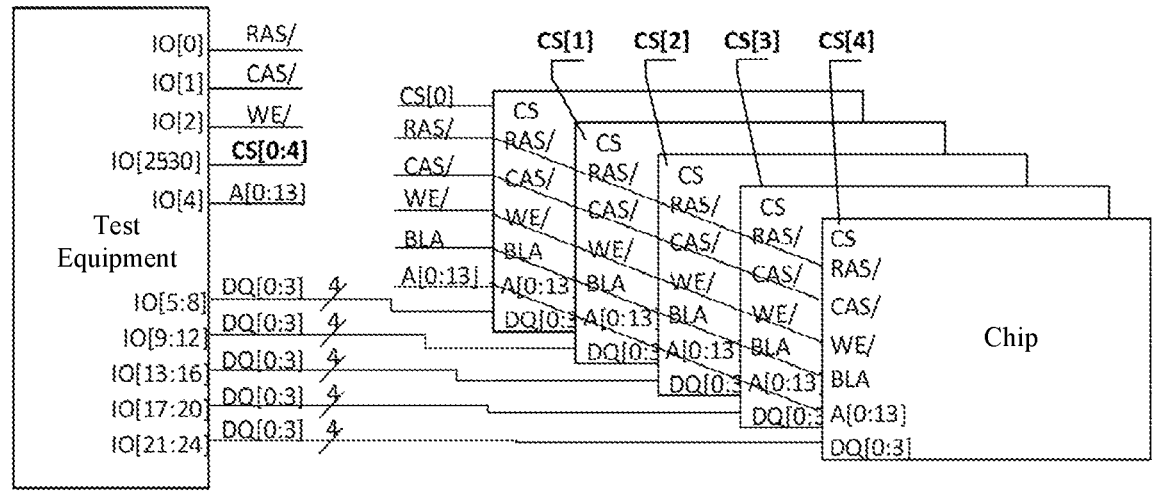
FIG. 1 is a schematic diagram of a test scenario for multiple DUTs in the related art.

The embodiments will be described more completely in conjunction with the accompanying drawings. However, the embodiments can be implemented in various forms, and should not be limited to the embodiments described herein. Instead, these embodiments are provided to describe the present invention thorough and complete, and convey the concepts of the embodiments to those skilled in the art fully.

The described characteristics, structures, or properties may be combined in one or more embodiments in any appropriate manner. In the following description, many particular details are provided to give a full understanding on the embodiments of the present invention. However, it would be appreciated by those skilled in the art that one or more of the particular details may be omitted by the practice of the technical solutions of the present invention, or other methods, components, apparatuses, steps, and the like may be adopted. In other cases, the known technical solutions are not illustrated or described in detail to prevent distracting and obscuring aspects of the present invention.

Additionally, the accompanying drawings are merely schematic diagrams of the present invention. The identical reference symbols in the drawings represent identical or similar parts, and therefore, the duplicated descriptions thereof are omitted. Some block diagrams in the accompanying drawings are functional entities, which do not necessarily correspond to physically or logically independent entities. These functional entities may be implemented in a software form, or implemented in one or more hardware modules or integrated circuits, or in different networks and/or processor apparatuses and/or microcontroller apparatuses.

The embodiments of the present invention are described below in detail with reference to the accompanying drawings.

Figure 2A:
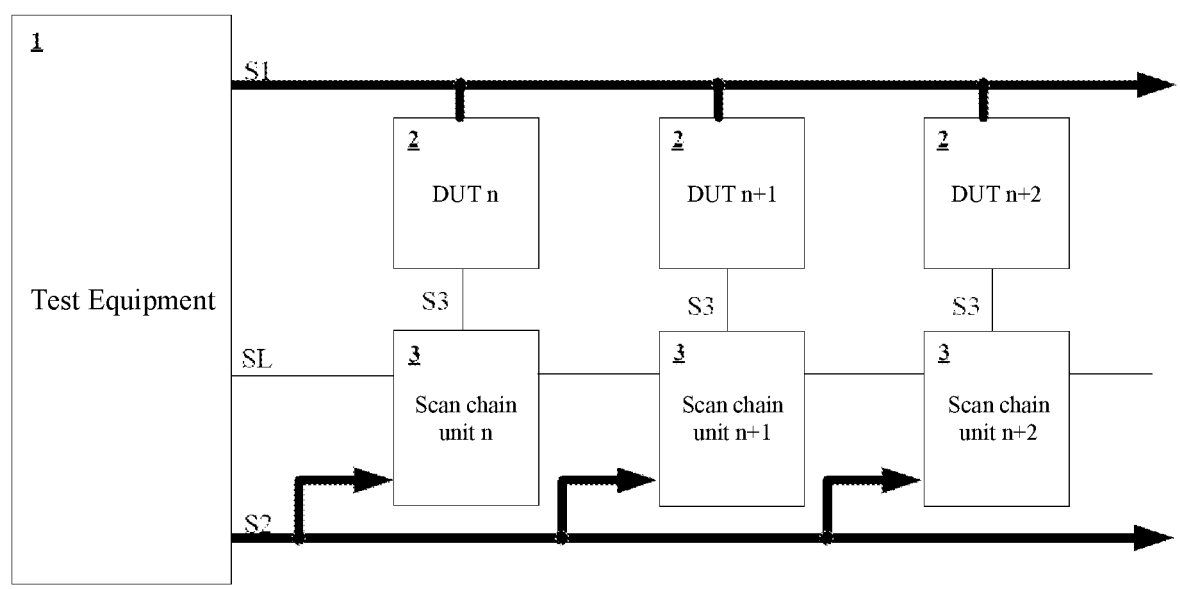
FIG. 2A and FIG. 2B are diagrams of a test system in an embodiment of the present invention.
Figure 2B:
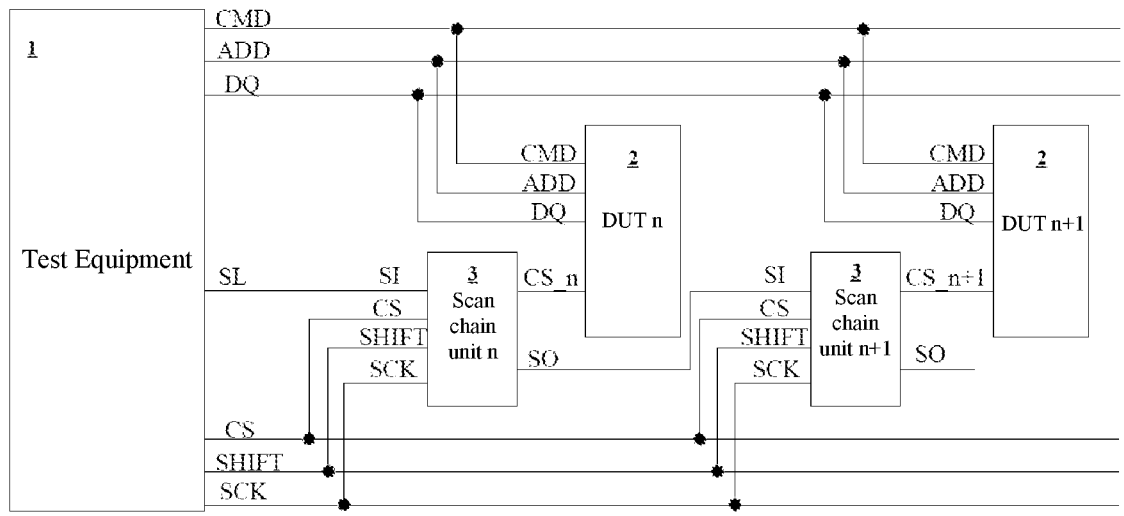

FIG. 2A and FIG. 2B are diagrams of a test system in an embodiment of the present invention.

Referring to FIG. 2A, in this embodiment of the present invention, the test system 200 may include: a test equipment 1, having a first signal line S1, a second signal line S2, and a serial signal line SL; a plurality of DUTs 2 (i.e., n DUTs), coupled to the test equipment 1 via the first signal line S1; and n serially-connected scan chain units 3, coupled to the test equipment 1 via the second signal line S2, and respectively coupled to the n DUTs via a third signal line S3, wherein a first scan chain unit is coupled to the serial signal line SL of the test equipment 1.

In the embodiment shown in FIG. 2A, the first signal line S1 and the second signal line S2 may respectively include multiple signal lines having multiple varieties, and the third signal line is configured to perform signal transmission between the DUTs and the corresponding scan chain units.

FIG. 2B is one embodiment of a test system in FIG. 2A.

In FIG. 2B, the first signal line includes a data signal line DQ, an address signal line ADD, and a control signal line CMD. The second signal line includes a scan enable signal line SHIFT, a synchronous clock signal line SCK, and a chip selection signal line CS. The third signal line includes a secondary chip selection signal line CS_n.

The test equipment 1 has a control signal line CMD, an address signal line ADD, a data signal line DQ, a chip selection line CS, a synchronous clock signal line SCK, a scan enable signal line SHIFT, and a serial signal line SL.

The n DUTs 2 are coupled to the test equipment 1 via the control signal line CMD, the address signal line ADD, and the data signal line DQ.

The n serially-connected scan chain units 3 are coupled to the test equipment 1 via the chip selection signal line CS_n, the synchronous clock signal line SCK, and the scan enable signal line SHIFT, and respectively coupled to chip selection signal lines CS of the n DUTs via n secondary chip selection signal lines CS_n. Each scan chain unit is coupled to a serial signal output port SO of a previous scan chain unit via a serial signal input port SI.

In the embodiment shown in FIG. 2B, all DUTs 2 share the control signal line CMD, the address signal line ADD, and the data signal line DQ. The actual chip selection statuses are controlled by corresponding scan chain units via output signals of the secondary chip selection signal lines CS_n.

All scan chain units 3 share the chip selection signal line CS, the synchronous clock signal line SCK for controlling a serial signal shift register and the scan enable signal line SHIFT, and a serial signal input port of a first scan chain unit is coupled to the serial signal line SL of the test equipment. When the scan enable signal line SHIFT is in an activated status, each scan chain unit 3 may receive and store one bit of data on the serial signal input port SI with the change of a synchronous clock signal (i.e., at the rising edge of the clock signal), and transmit one previously-stored bit of data to the serial signal output port SO. As such, a signal is provided for a serial signal input port of a next scan chain unit, and each bit of a serial signal output by the test equipment 1 is transmitted to a corresponding scan chain unit according to a sequence of serial connection of the scan chain units.

Each scan chain unit may determine a chip selection status with a chip selection signal via the signal received by the serial signal input port, and then control an actual chip selection status of a corresponding DUT via an output signal of the secondary chip selection signal line CS_n.

As can be seen from the above structure, the system for testing the DUTs provided by this embodiment of the present invention may control an output signal of each scan chain unit via a status of each bit of a serial signal. Thus, limited I/O pins are used to test multiple DUTs, and the individual testing on one or more DUTs in the multiple DUTs is implemented.

Figure 3:
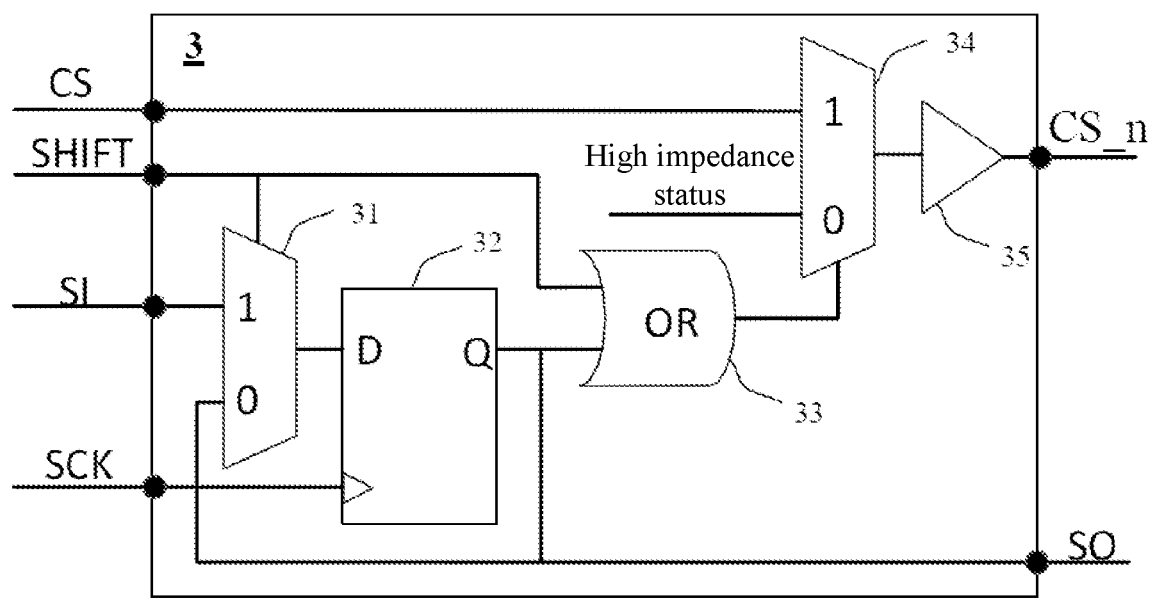
FIG. 3 is a circuit schematic diagram of a scan chain reg in an embodiment of the present invention.

FIG. 3 is a circuit schematic diagram of a scan chain unit in an embodiment shown in FIG. 2B.

Referring to FIG. 3, in some embodiments, each scan chain unit may include: a first multiplexer 31, including a first input pin coupled to a serial signal input pin SI, a second input pin coupled to a serial signal output port SO, and a control pin coupled to the scan enable signal line SHIFT; a D flip-flop 32, including an input pin D coupled to an output pin of the first multiplexer 31, an output pin coupled to the serial signal output port SO, and a control pin coupled to the synchronous clock signal line SCK; an OR gate 33, including a first input pin coupled to the scan enable signal line SHIFT, and a second input pin coupled to the serial signal output port SO; a second multiplexer 34, including a first input pin coupled to the chip selection signal line CS, a second input pin in a high impedance status, and a control pin coupled to an output pin of the OR gate 33; and a driver 35, including an input pin coupled to an output pin of the second multiplexer 34, and an output pin coupled to the secondary chip selection signal line CS_n, and configured to increase a power of an output signal.

FIG. 4 is a time diagram of control of a scan chain unit shown in FIG. 3.

Referring to FIG. 3 and FIG. 4, in the embodiment shown in FIG. 3, when an input signal of the scan enable signal line SHIFT is "1", the output pin of the OR gate is "1". The second multiplexer 34 outputs the signal on the first input pin thereof. At this time, the secondary chip selection signal CS_n is equal to a chip selection signal CS sent by the test equipment. If the chip selection signal CS sent by the test equipment 1 is in the activated status at this time, a write operation may be simultaneously performed on all DUTs.

At this time, the first multiplexer 31 controls that a signal on the output pin is equal to the signal on the first input pin, and that a signal on the input pin of the D flip-flop 32 is equal to a signal on the serial signal input port SI, namely an n-th bit of the serial signal. When the control pin of the D flip-flop 32 receives a rising edge of the synchronous clock signal on the synchronous clock signal line SCK, the signal on the input pin is transmitted to the output pin (i.e., serial signal line SL) and latched. As the serial signal line SL is coupled to a serial signal input port SI of a next scan chain unit, the n-th bit of the serial signal is transmitted to the next scan chain unit. When a next rising edge of the synchronous clock signal comes, a D flip-flop of the next scan chain unit latches the n-th bit of the serial signal, and the D flip-flop of this scan chain unit latches a (n+1)-th serial signal.

When the number of bits of the serial signal is the same as the number of the DUTs, upon the completion of the output of all serial signals and corresponding synchronous clock signals, the D flip-flops of the serially-connected scan chain units respectively latch one bit of the serial signal.

When the input signal of the scan enable signal line SHIFT is "0", the first multiplexer 31 controls that the output signal is equal to the signal on the second input pin, namely a signal on the output pin of the D flip-flop 32. When the synchronous clock signal comes, the D flip-flop 32 continuously latches the signal on the output pin and outputs to the output pin. Therefore, status of the OR gate is unchanged.

If a latched state of the D flip-flop 32 of the scan chain unit at this time is "1", the output of the OR gate 33 is "1", the signal on the output pin of the second multiplexer 34 is equal to the chip selection signal, and the secondary chip selection signal CS_n is equal to the chip selection signal CS. If the latched state of the D flip-flop 32 of the scan chain unit is "0", the output of the OR gate 33 is "0", the signal on the output pin of the second multiplexer 34 is equal to the high impedance and is not output. The secondary chip selection signal CS_n is null (or the default is '0').

Therefore, when the test equipment 1 sends an activated signal, only a DUT corresponding to a scan chain unit latching the serial signal "1" is activated (CS_n=1), i.e., the individual chip selection for one or more DUTs may be implemented by setting a corresponding relationship between a state of each bit of the serial signal and a position of each scan chain unit.

Figure 5B:
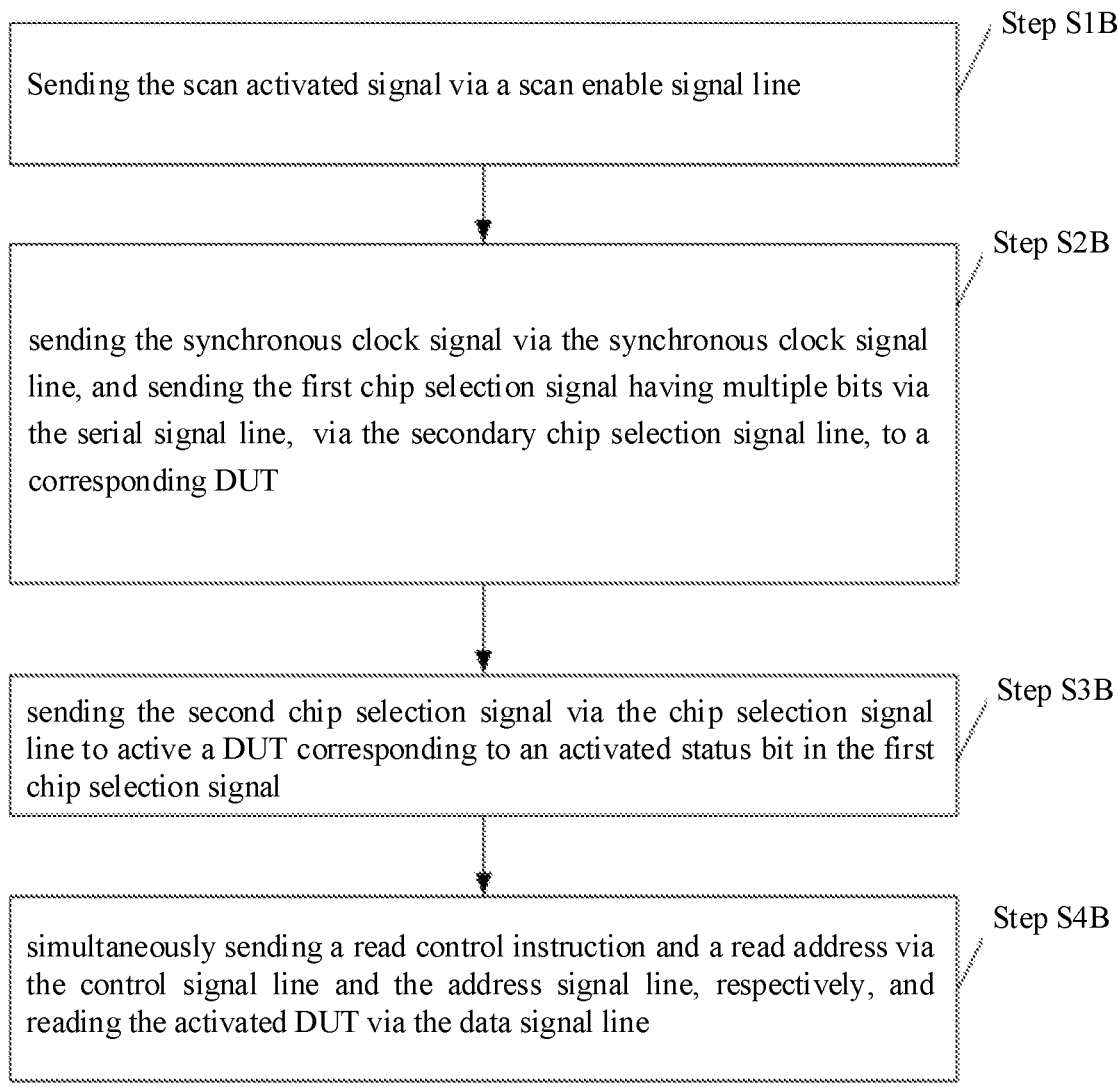

FIG. 5A and FIG. 5B systematically show a flowchart of a test method in an embodiment of the present invention. Referring to FIG. 5A, the test method for the test equipment shown in FIG. 2A and FIG. 2B may include the following steps.

Step S1A: Send a scan activated signal and asynchronous clock signal via a second signal line, and simultaneously output n bits of a first preset signal via a serial signal line, so that each bit of the first preset signal is transmitted to a corresponding scan chain unit in a serial connection sequence of scan chain units according to the synchronous clock signal.

Step S2A: Send a scan deactivated signal via the second signal line and maintain the scan deactivated signal, so as to deactivate the scan chain units from continuously identifying and receiving the first preset signal.

Step S3A: Send a second preset signal via the second signal line and send a test signal via the first signal line.

In the embodiment shown in FIG. 5A, the third signal line may be configured to transmit the signal from the scan chain units to DUTs, and may also be configured to transmit the signal from the DUTs to the scan chain units.

With the test equipment shown in FIG. 2B, the test method may further include the following steps.

Step S1B: Send a scan activated signal via a scan enable signal line.

Step S2B: Send the synchronous clock signal via a synchronous clock signal line, and simultaneously send n bits of a first chip selection signal via the serial signal line. Each bit of the first chip selection signal is transmitted to one corresponding scan chain unit in the sequence of serial connection of the scan chain units according to the synchronous clock signal, and transmitted, via a secondary chip selection signal line, to a DUT corresponding to each scan chain unit.

Step S3B: Send the scan deactivated signal via a scan enable signal line and maintain the scan deactivated signal to deactivate the scan chain units from continuously identifying and receiving the first preset signal.

Step S4B: Send a second chip selection signal via the chip selection signal line, and send the test signal via a control signal line, an address signal line, and a data signal line.

Figure 6:
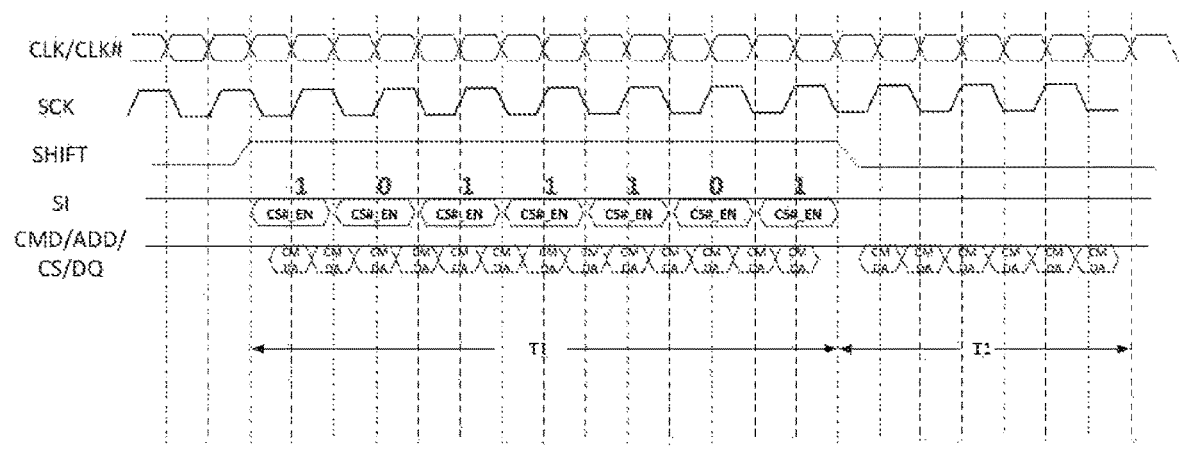
FIG. 6 is a time diagram of control of a test method shown in FIG. 5B.

FIG. 6 is a time diagram of control of a test method shown in FIG. 5B.

Referring to FIG. 6, within a T1 stage, the scan activated signal is equal to "1" and the serial signal SI is output, where each bit of the serial signal SI corresponds to one scan chain unit and one DUT. Each scan chain unit shifts and registers the signal on the serial signal SI. Under the control of a synchronous clock signal, each scan chain unit latches one bit of the serial signal to control a chip selection status of a corresponding DUT. During this process, as the scan activated signal is equal to "1", the data on a chip selection signal line CS of each DUT is the same as that of a chip selection signal line CS of the test equipment, and is free from the influence of the latching of the serial signal in each scan chain unit. At this time, normal write may be performed on each DUT.

Within a T2 stage, the scan activated signal is equal to "0". The DUT whose corresponding scan chain unit latches "1", has the data on a chip selection signal line CS the same as that of the chip selection signal line CS of the test equipment. The DUT whose corresponding scan chain unit latches "0", has the chip selection signal CS corresponding to no chip selection. When the test equipment outputs the chip selection signal, only the DUT latching the "1" signal in the corresponding scan chain unit enters a chip selection status. With the above manner, the test equipment may individually control multiple DUTs.

In some embodiments, the simultaneous write on multiple DUTs may be implemented via the following manner.

By sending the second chip selection signal via the chip selection signal line CS, a DUT corresponding to an activated status bit in the first chip selection signal is activated.

Simultaneously, a write control instruction, a write address, and write data may be sent via the control signal line, the address signal line, and the data signal line.

Since each DUT shares the data signal line DQ, each DUT cannot be read simultaneously. In order to read a DUT, only one bit of a serial signal may be set in the activated status to control only one of the multiple DUTs to enter the chip selection status and be read.

The read operation on one DUT may be, for example, as follows.

By sending the second chip selection signal via the chip selection signal line CS, a DUT corresponding to an activated status bit in the first chip selection signal is activated.

Simultaneously, a read control instruction and a read address may be sent via the control signal line CMD and the address signal line ADD. Via the data signal line DQ, the DUT that is in the activated status and corresponds to the chip selection signal may be read.

When each DUT needs to be read, different bit of the first chip selection signal may be set in the activated status at each time, and the read operation is performed accordingly.

According to the method provided by this embodiment of the present invention, by writing one bit of a serial signal to each scan chain unit, a DUT corresponding to each scan chain unit may be controlled to enter a chip selection status when a test equipment send a chip selection signal. Thus, the individual control on multiple DUTs may be implemented via a serial signal line IO interface to effectively save the interfaces and to improve the test efficiency.

Corresponding to the above method embodiment, the present invention further provides a test equipment, which may be configured to execute the above method.

Figure 7:
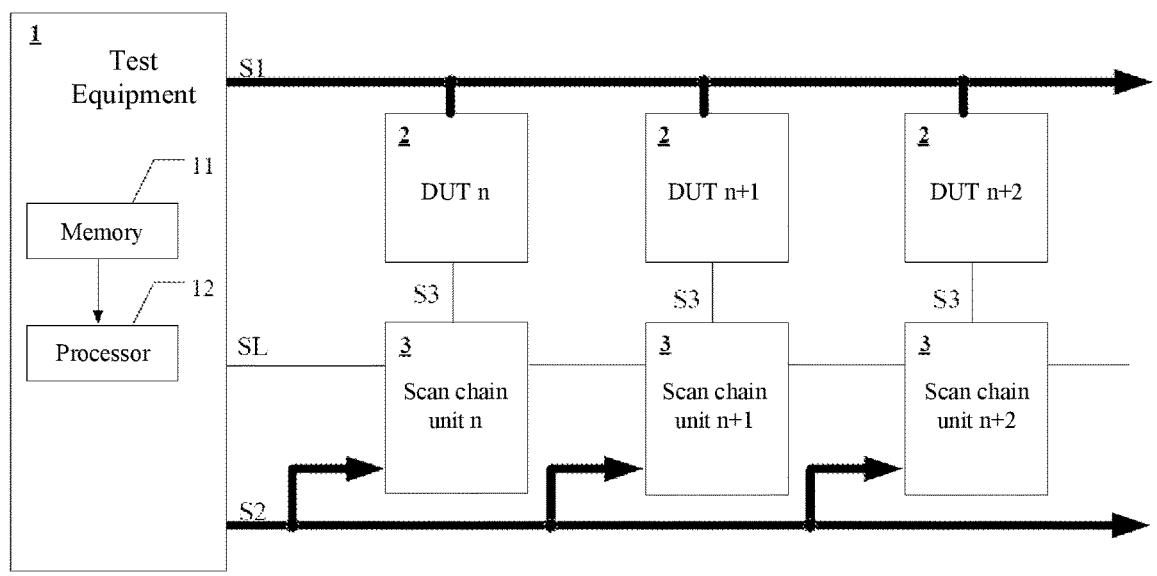
FIG. 7 is a block diagram of a test equipment in an embodiment of the present invention.

FIG. 7 shows a block diagram of a test equipment in an embodiment of the present invention.

Referring to FIG. 7, the test equipment 1 may include:

a first signal line S1, a second signal line S2, and a serial signal line SL, wherein the first signal line S1 is coupled to multiple DUTs 2, the second signal line S2 is coupled to multiple scan chain units 3, the multiple scan chain units are respectively coupled to the multiple DUTs via a third signal line S3, the multiple scan chain units 3 are serially connected, a first scan chain unit is coupled to the serial signal line SL, and each scan chain unit 3 includes a D flip-flop and a multiplexer; a memory 11; and a processor 12 coupled to the memory, wherein the processor 12 is configured to execute, based on an instruction stored in the memory, the test method according to any one of the above embodiments.

The functions of the test equipment 1 have been described in detail in the corresponding method embodiments and will not be repeated herein.

It is to be noted that a plurality of modules or units of a device for executing an action are mentioned in the detailed description, but such a division is not mandatory. As a matter of fact, according to the embodiments of the present invention, the characteristics and functions of the above two or more modules or units may be implemented in one module or unit. On the contrary, the characteristics and functions of the above described one module or unit may further be divided and implemented via multiple modules or units.

As will be appreciated by those skilled in the art, aspects of the present invention may be implemented as a system, method, or program product. Accordingly, the aspects of the present invention may take the form of an entirely hardware embodiment, an entirely software embodiment (including firmware, micro-code, etc.) or an embodiment combining software and hardware aspects that may all generally be referred to herein as a "circuit," "module," or "system."

With the description in the above embodiments, it is easily understood by those skilled in the art that the exemplary embodiments described herein may be implemented via software, and may also be implemented in a manner of software plus necessary hardware. Therefore, the technical solutions according to the embodiments of the present invention may be embodied in the form of a software product. The software product may be stored on a nonvolatile storage medium (which may be a CD-ROM, a U disk, a mobile hard disk, etc.) or a network, and includes a plurality of instructions to enable a set of computing device (which may be a personal computer, a server, a terminal device, or a network device, etc.) to execute the method according to the embodiments of the present invention.

In an embodiment of the present invention, there is further provided a computer readable storage medium, which stores a program product capable of implementing the above method in the specification. In some possible embodiments, each aspect of the present invention may further be implemented as a form of a program product. The program product includes a program code. When the program product is run on a terminal device, the program code is configured to enable the terminal device to execute the steps of each exemplary embodiment of the present invention in the "exemplary methods" of the specification.

Any combination of one or more readable media may be utilized by the program product. The readable medium may be a readable signal medium or a readable storage medium. The readable storage medium may be, for example, but not limited to, an electronic, magnetic, optical, electromagnetic, infrared, or semiconductor system, apparatus, or device, or any combination of the foregoing. More specific examples (a non-exhaustive list) of the readable storage medium would include an electrical connection having one or more wires, a portable diskette, a hard disk, a random access memory (RAM), a read-only memory (ROM), an erasable programmable read-only memory (EPROM or flash memory), an optical fiber, a portable compact disc read-only memory (CD-ROM), an optical storage device, a magnetic storage device, or any suitable combination of the foregoing.

The computer readable signal medium may include a propagated data signal, with a readable program code carried therein, in a baseband or as part of a carrier wave. Such a propagated data signal may take a variety of forms, including but not limited to an electromagnetic signal, an optical signal or any suitable combination of the foregoing. The readable signal medium may be any readable medium that is not a readable storage medium and that can send, propagate, or transmit a program for use by or in connection with an instruction execution system, apparatus, or device.

The program code embodied on a readable medium may be transmitted using any appropriate medium, including but not limited to wireless, wireline, optical fiber cable, RF, and the like, or any suitable combination of the foregoing.

The program code for carrying out operations of the present invention may be written in any combination of one or more programming languages, including object oriented programming languages such as Java, C++ or the like, and conventional procedural programming languages such as the "C" language or similar programming languages. The program code may be executed entirely on a user's computing device, executed partly on a user device, executed as a stand-alone software package, executed partly on the user's computing device and partly on a remote computing device, or executed entirely on the remote computing device or a server. In a scenario involving the remote computing device, the remote computing device may be connected to an external computing device through any type of network, including a local area network (LAN) or a wide area network (WAN), or the connection may be made to an external computing device (for example, through an Internet using an Internet service provider).

In addition, the above accompanying drawings are merely schematic descriptions on processing included in the method according to the exemplary embodiment of the present invention and are not intended to limit the present invention. It is easily understood that the processing in the accompanying drawings does not indicate or limit a time sequence of these processing. Additionally, it is also easily understood that these processing may be, for example, executed in multiple modules synchronously or asynchronously.

What is claimed is:

1. A test method for a test equipment, comprising:
coupling the test equipment to a plurality of devices under testing (DUTs) via a first signal line, to a plurality of scan chain units via a second signal line, and to a first scan chain unit of the plurality of scan chain units via a serial signal line, the scan chain units are serially connected and each comprise a serial signal input port, a serial signal output port, and a secondary chip selection signal line, and wherein each scan chain unit of the plurality of scan chain units is coupled to a corresponding DUT of the plurality of DUTs via the corresponding secondary chip selection signal line, and wherein, for each scan chain unit in the plurality of scan chain units except the first scan chain unit, the serial signal input port of the scan chain unit is connected to the serial output port of the preceding serially-connected scan chain unit;
sending a scan activated signal and a synchronous clock signal via the second signal line, and sending a first preset signal having a plurality of bits via the serial signal line, wherein each bit of the first preset signal is transmitted to a corresponding scan chain unit in a sequence of serial connection of the plurality of scan chain units according to the synchronous clock signal, wherein the corresponding scan chain unit is one of the plurality of scan chain units;
sending a scan deactivated signal via the second signal line, to deactivate the scan chain units from identifying and receiving the first preset signal; and
sending a second preset signal via the second signal line, and sending a test signal via the first signal line.

2. The method according to claim 1, wherein
the first signal line comprises a data signal line, an address signal line, and a control signal line;
the second signal line comprises a scan enable signal line, a synchronous clock signal line, and a chip selection signal line;
the first preset signal comprises a first chip selection signal; and
the second preset signal comprises a second chip selection signal.

3. The method according to claim 2, wherein sending the scan activated signal and the synchronous clock signal via the second signal line, and sending the first preset signal via the serial signal line comprises:
sending the scan activated signal via the scan enable signal line; and
sending the synchronous clock signal via the synchronous clock signal line, and sending the first chip selection signal having a plurality of bits via the serial signal line, via the secondary chip selection signal line, to a corresponding DUT.

4. The method according to claim 2, wherein sending the second preset signal via the second signal line and sending the test signal via the first signal line comprises:
sending the second chip selection signal via the chip selection signal line to active a DUT corresponding to an activated status bit in the first chip selection signal; and
simultaneously sending a write control instruction, a write address, and write data via the control signal line, the address signal line, and the data signal line, respectively.

5. The method according to claim 2, wherein
the first chip selection signal comprises more than one activated status bits thereof, and wherein sending the second preset signal via the second signal line, and sending the test signal via the first signal line comprises:
sending the second chip selection signal to active more than one DUTs corresponding to the more than one activated status bits of the first chip selection signal; and
simultaneously sending a write control instruction, a write address, and write data to the more than one activated DUTs.

6. The method according to claim 2, wherein when only one bit in the first chip selection signal is in an activated status, sending the second preset signal via the second signal line and sending the test signal via the first signal line comprises:
sending the second chip selection signal via the chip selection signal line to active a DUT corresponding to an activated status bit in the first chip selection signal; and
simultaneously sending a read control instruction and a read address via the control signal line and the address signal line, respectively, and reading the activated DUT via the data signal line.

7. A test system, comprising:
a test equipment, having a first signal line, a second signal line, and a serial signal line;
a plurality of devices under testing (DUTs), coupled to the test equipment via the first signal line; and
a plurality of serially-connected scan chain units coupled to the test equipment via the second signal line, wherein a first scan chain unit of the plurality of scan chain units is coupled to the test equipment via the serial signal line, wherein each scan chain unit of the plurality of scan chain units comprises a serial signal input port, a serial signal output port, and a secondary chip selection signal line, each scan chain unit of the plurality of scan chain units is coupled to a corresponding DUT of the plurality of DUTs via the corresponding secondary chip selection signal line, and wherein, for each scan chain unit in the plurality of scan chain units except the first scan chain unit, the serial signal input port is connected to the serial signal output port of the preceding serially-connected scan chain unit, and wherein the test equipment is configured to:
send a scan activated signal and a synchronous clock signal via the second signal line, and send a first preset signal having a plurality of bits via the serial signal line, wherein each bit of the first preset signal is transmitted to a corresponding scan chain unit in a sequence of serial connection of the scan chain units according to the synchronous clock signal, wherein the corresponding scan chain unit is one of the plurality of scan chain units;
send a scan deactivated signal via the second signal to deactivate the scan chain units from identifying and receiving the first preset signal; and send a second preset signal via the second signal line, and send a test signal via the first signal line.

8. The system according to claim 7, wherein
the first signal line comprises a data signal line, an address signal line, and a control signal line; and
the second signal line comprises a scan enable signal line, a synchronous clock signal line, and a chip selection signal line.

9. The system according to claim 8, wherein each scan chain unit comprises:
a first multiplexer comprising a first input pin coupled to a serial signal input port, a second input pin coupled to a serial signal output port, and a control pin coupled to the scan enable signal line;
a D flip-flop comprising an input pin coupled to an output pin of the first multiplexer, an output pin coupled to the serial signal output port, and a control pin coupled to the synchronous clock signal line;
an OR gate comprising a first input pin coupled to the scan enable signal line, and a second input pin coupled to the serial signal output port;
a second multiplexer comprising a first input pin coupled to the chip selection signal line, a second input pin in a high impedance status, and a control pin coupled to an output pin of the OR gate; and
a driver comprising an input pin coupled to an output pin of the second multiplexer, and an output pin coupled to the secondary chip selection signal line.

10. The system according to claim 8, wherein the test equipment is further configured to:
send the scan activated signal via the scan enable signal line;
send the synchronous clock signal via the synchronous clock signal line, and send a first chip selection signal having a plurality of bits via the serial signal line, via the secondary chip selection signal line, to a corresponding DUT;
send a scan deactivated signal via the scan enable signal line; and
send a second chip selection signal via the chip selection signal line, and send the test signal via the control signal line, the address signal line, and the data signal line.

11. The system according to claim 10, wherein to send the second chip selection signal via the chip selection signal line, and to send the test signal via the control signal line, the address signal line, and the data signal line, the test equipment is configure to:
send the second chip selection signal via the chip selection signal line to active a DUT corresponding to an activated status bit in the first chip selection signal; and
simultaneously send a write control instruction, a write address, and write data via the control signal line, the address signal line, and the data signal line, respectively.

12. The system according to claim 10, wherein
the first chip selection signal comprises more than one activated status bits thereof, and wherein to send the second chip selection signal via the chip selection signal line, and to send the test signal via the control signal line, the address signal line, and the data signal line, the test equipment is configured to:
send the second chip selection signal to active more than one DUTs corresponding to the more than one activated status bits of the first chip selection signal; and simultaneously send a write control instruction, a write address, and write data to the more than one activated DUTs.

13. The system according to claim 10, wherein when only one bit in the first chip selection signal is in an activated status, and wherein, to send the second chip selection signal via the chip selection signal line, and to send the test signal via the control signal line, the address signal line, and the data signal line, the test equipment is configured to:
send the second chip selection signal via the chip selection signal line to active a DUT corresponding to an activated status bit in the first chip selection signal; and
simultaneously send a read control instruction and a read address via the control signal line and the address signal line, respectively, and read the activated DUT via the data signal line.

14. A test equipment, comprising:
a first signal line, a second signal line, and a serial signal line, wherein the first signal line is coupled to a plurality of devices under testing (DUTs), the second signal line is coupled to a plurality of scan chain units, the plurality of scan chain units are serially connected, a first scan chain unit of the plurality of scan chain units is coupled to the serial signal line, and each scan chain unit of the plurality of scan chain units comprises a serial signal input port, a serial signal output port, and a secondary chip selection signal line, each scan chain unit of the plurality of scan chain units comprises at least a D flip-flop and a multiplexer, and is coupled to a corresponding DUT of the plurality of DUTs via the corresponding secondary chip selection signal line, and wherein, for each scan chain unit in the plurality of scan chain units except the first scan chain unit, the serial signal input port is connected to the serial signal output port of the preceding serially-connected scan chain unit;
a memory; and
a processor coupled to the memory, wherein the processor is configured to execute an instruction stored in the memory to perform operations including:
sending a scan activated signal and a synchronous clock signal via the second signal line, and sending a first preset signal having a plurality of bits via the serial signal line, wherein each bit of the first preset signal is transmitted to a corresponding scan chain unit in a sequence of serial connection of a plurality of scan chain units according to the synchronous clock signal, wherein the corresponding scan chain unit is one of the plurality of scan chain units;
sending a scan deactivated signal via the second signal line, to deactivate the scan chain units from identifying and receiving the first preset signal; and
sending a second preset signal via the second signal line, and sending a test signal via the first signal line.

15. A non-transitory computer readable storage medium, storing a program executable by a processor, wherein upon being executed by the processor, the program causes the processor to perform operations including:
sending a scan activated signal and a synchronous clock signal via a second signal line, and sending a first preset signal having a plurality of bits via a serial signal line, wherein each bit of the first preset signal is transmitted to a corresponding scan chain unit in a sequence of serial connection of a plurality of scan chain units according to the synchronous clock signal, wherein the corresponding scan chain unit is one of the plurality of scan chain units connected serially, wherein each scan chain unit of the plurality of scan chain units comprises a serial signal input port, a serial signal output port, and a secondary chip selection signal line, each scan chain unit of the plurality of scan chain units is coupled to a corresponding DUT of the plurality of DUTs via the corresponding secondary chip selection signal line, and wherein, for each scan chain unit in the plurality of scan chain units except the first scan chain unit, the serial signal input port is connected to the serial signal output port of the preceding serially-connected scan chain unit;

sending a scan deactivated signal via the second signal line, to deactivate the scan chain units from identifying and receiving the first preset signal; and sending a second preset signal via the second signal line, and sending a test signal via a first signal line.

16. The non-transitory computer readable storage medium of claim 15, wherein the first signal line comprises a data signal line, an address signal line, and a control signal line;

the second signal line comprises a scan enable signal line, a synchronous clock signal line, and a chip selection signal line;

the first preset signal comprises a first chip selection signal; and the second preset signal comprises a second chip selection signal.

17. The non-transitory computer readable storage medium of claim 16, wherein sending the scan activated signal and the synchronous clock signal via the second signal line and sending the first preset signal via the serial signal line comprises:

sending the scan activated signal via the scan enable signal line; and sending the synchronous clock signal via the synchronous clock signal line, and sending the first chip selection signal having a plurality of bits via the serial signal line, via the secondary chip selection signal line, to a corresponding DUT.

18. The non-transitory computer readable storage medium of claim 16, wherein sending the second preset signal via the second signal line and sending the test signal via the first signal line comprises:

sending the second chip selection signal via the chip selection signal line to active a DUT corresponding to an activated status bit in the first chip selection signal; and simultaneously sending a write control instruction, a write address, and write data via the control signal line, the address signal line, and the data signal line, respectively.

19. The non-transitory computer readable storage medium of claim 16, wherein when only one bit in the first chip selection signal is in an activated status, sending the second preset signal via the second signal line and sending the test signal via the first signal line comprises:

sending the second chip selection signal via the chip selection signal line to active a DUT corresponding to an activated status bit in the first chip selection signal; and simultaneously sending a read control instruction and a read address via the control signal line and the address signal line, respectively, and reading the activated DUT via the data signal line.

\* \* \* \* \*